(12) United States Patent
Yin et al.

(10) Patent No.: US 8,405,062 B2
(45) Date of Patent: Mar. 26, 2013

(54) METHOD OF FORMING POLY-SI PATTERN, DIODE HAVING POLY-SI PATTERN, MULTI-LAYER CROSS POINT RESISTIVE MEMORY DEVICE HAVING POLY-SI PATTERN, AND METHOD OF MANUFACTURING THE DIODE AND THE MEMORY DEVICE

(75) Inventors: Huaxiang Yin, Yongin-si (KR); Young-soo Park, Yongin-si (KR); Wenxu Xianyu, Yongin-si (KR); Hans S. Cho, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 666 days.

(21) Appl. No.: 11/713,738

(22) Filed: Mar. 5, 2007

(65) Prior Publication Data

US 2008/0026547 A1    Jan. 31, 2008

(30) Foreign Application Priority Data

Jul. 27, 2006    (KR) .................. 10-2006-0070884

(51) Int. Cl.
*H01L 47/00*    (2006.01)
(52) U.S. Cl. .................. 257/4; 257/2; 257/3; 257/5
(58) Field of Classification Search .................. 438/486, 438/487, 496; 257/421, 2–5
See application file for complete search history.

(56) References Cited

U.S. PATENT DOCUMENTS

| | | | |
|---|---|---|---|
| 5,751,012 A * | 5/1998 | Wolstenholme et al. ......... 257/5 | |
| 6,927,430 B2 | 8/2005 | Hsu | |
| 7,615,502 B2 * | 11/2009 | Gu .................. 438/795 | |
| 7,835,177 B2 * | 11/2010 | Hsu et al. .................. 365/163 | |
| 2003/0067013 A1 | 4/2003 | Ichihara et al. | |
| 2003/0086284 A1 * | 5/2003 | Johnson .................. 365/105 | |
| 2004/0256697 A1 | 12/2004 | Jang | |
| 2005/0052915 A1 | 3/2005 | Herner et al. | |
| 2005/0158950 A1 * | 7/2005 | Scheuerlein et al. .......... 438/257 | |
| 2005/0207248 A1 | 9/2005 | Hsu | |
| 2005/0260857 A1 | 11/2005 | Huang et al. | |
| 2006/0157683 A1 * | 7/2006 | Scheuerlein .................. 257/4 | |
| 2006/0237756 A1 * | 10/2006 | Park et al. .................. 257/296 | |
| 2006/0249725 A1 * | 11/2006 | Lee .................. 257/4 | |
| 2006/0284156 A1 * | 12/2006 | Happ .................. 257/2 | |
| 2006/0284237 A1 * | 12/2006 | Park et al. .................. 257/314 |

(Continued)

FOREIGN PATENT DOCUMENTS

| | | |
|---|---|---|
| CN | 1417803 | 5/2003 |
| CN | 1581438 | 2/2005 |

(Continued)

OTHER PUBLICATIONS

Office Action for Chinese patent application No. 200610172718.4 dated Dec. 4, 2009 with English translation.

(Continued)

*Primary Examiner* — David Vu
*Assistant Examiner* — Caleb Henry
(74) *Attorney, Agent, or Firm* — Harness, Dickey & Pierce P.L.C.

(57) ABSTRACT

A method of forming a poly-silicon pattern may include forming an amorphous silicon pattern on a lower layer; forming a capping layer on the substrate covering the amorphous silicon pattern; poly-crystallizing the amorphous silicon pattern using an excimer laser annealing process; and removing the capping layer.

12 Claims, 7 Drawing Sheets

U.S. PATENT DOCUMENTS

2007/0132049 A1* 6/2007 Stipe .......................... 257/421
2007/0200108 A1* 8/2007 Noh et al. ..................... 257/4

FOREIGN PATENT DOCUMENTS

| JP | 7-235490 | 9/1995 |
| JP | 2003-303941 | 10/2003 |
| JP | 2004-193282 | 7/2004 |
| JP | 2005-175457 | 6/2005 |
| JP | 2005-347560 | 12/2005 |
| KR | 10-2003-0073371 | 9/2003 |

OTHER PUBLICATIONS

Chinese Office Action dated Jan. 20, 2011 and English translation of Chinese Office Action.
Office Action dated Apr. 26, 2012 for Korean Application No. KR 10-2006-0070884 and English translation thereof.
Japanese Office Action dated Jul. 31, 2012 issued in Japanese Application No. 2007-150691 and English translation thereof.

* cited by examiner

FIG. 3
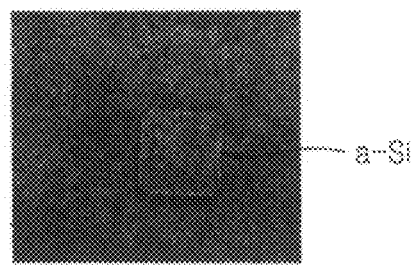
FIG.4A  FIG.4B  FIG.4C
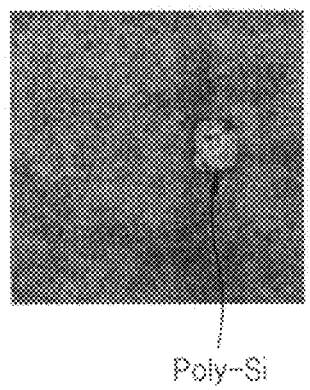 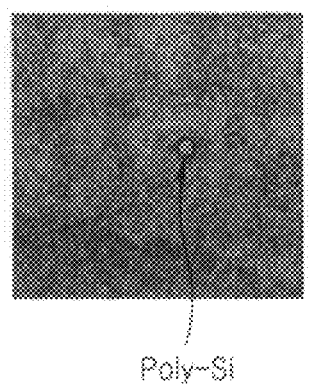 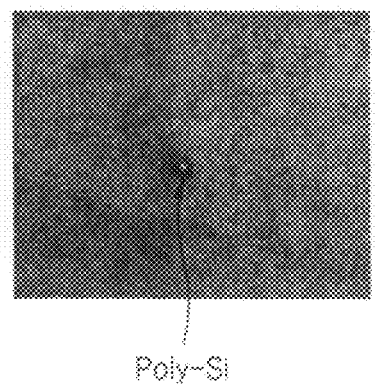
FIG.5
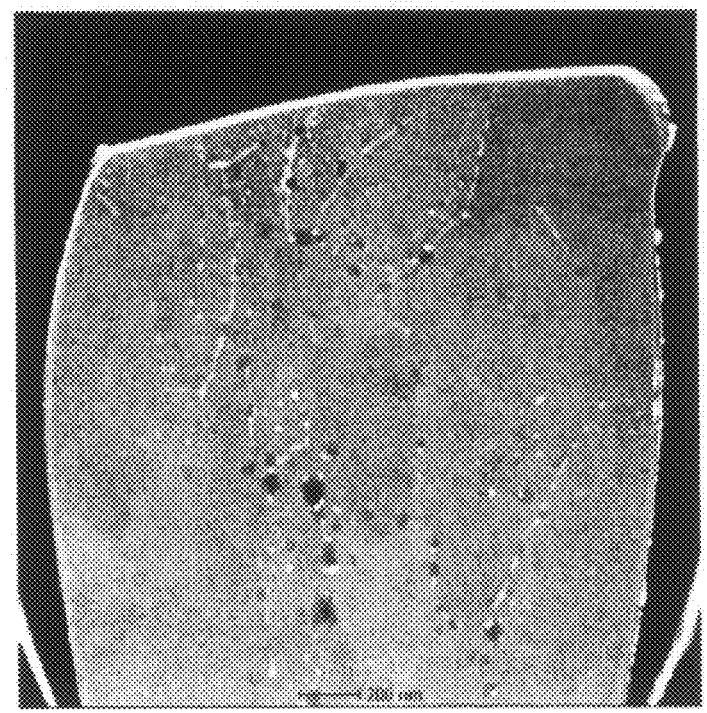

METHOD OF FORMING POLY-SI PATTERN, DIODE HAVING POLY-SI PATTERN, MULTI-LAYER CROSS POINT RESISTIVE MEMORY DEVICE HAVING POLY-SI PATTERN, AND METHOD OF MANUFACTURING THE DIODE AND THE MEMORY DEVICE

PRIORITY STATEMENT

This U.S. non-provisional application claims the benefit of priority to Korean Patent Application No. 10-2006-0070884, filed on Jul. 27, 2006, in the Korean Intellectual Property Office (KIPO), the disclosure of which is incorporated herein in its entirety by reference.

BACKGROUND

1. Field

Example embodiments relate to a method of forming a poly-silicon pattern, a diode having a poly-silicon pattern, a resistive memory device having a poly-silicon pattern, and a method of manufacturing the diode and the memory device. For example, a method of forming poly-silicon pattern using an excimer laser annealing process, a vertical diode formed of a poly-silicon pattern, a multi-layer cross point resistive memory device including a vertical diode formed of poly-silicon pattern, and a method of manufacturing the vertical diode and the memory device.

2. Description of the Related Art

Semiconductor memory devices may be classified as volatile memory devices and non-volatile memory devices. In a volatile memory device, recorded data may be erased if electric power is turned off. In a non-volatile memory device, recorded data may not be erased if electric power is turned off. Non-volatile memory devices may be widely used in computers, mobile communication terminals, and memory cards.

For example, data storage media may be used to store data for a long period of time, and may be used to move data to other places, for example, memory sticks. Thus, interest for non-volatile memory devices may be increasing.

The structure of a memory cell, which is a basic element in the non-volatile memory device, may vary with the field in which the non-volatile memory device is used.

For example, a memory cell may be included in a Not-And (NAND) type flash memory device, which is a higher capacitance non-volatile memory device that is widely used. In a NAND type flash memory device, a gate structure of a transistor may have a stacked structure that may include a floating gate in which electric charges, for example, data, may be stored, an inter-gate dielectric layer, and a control gate.

However, a flash memory device may have a lower degree of integration and a slower operating speed than a dynamic random access memory (DRAM), which is a volatile memory device. For example, because a flash memory device may use a conductive material, for example, a doped poly-silicon, as a material for forming the floating gate, a parasitic capacitance between gate structures may be increased if the memory device is more highly integrated.

Therefore, non-volatile memory devices that may improve on the weaknesses of the flash memory device are being actively researched. For example, a resistive random access memory (RRAM) that may have a resistive property that may vary according to an applied voltage may be suggested.

For example, a multi-layer cross point RRAM device may be used because it may be highly-integrated.

FIG. 1 is a perspective view of a conventional multi-layer cross point RRAM device. Referring to FIG. 1, a multi-layer cross point RRAM device may include a plurality of conductive lines M formed on a semiconductor substrate (not shown) with constant intervals therebetween. First stacked patterns P1 may be formed as lines and may be formed above the conductive lines M with constant intervals therebetween. The first stacked patterns P1 may be separated by a predetermined or desired distance from an upper surface of the conductive lines M. The first stacked patterns P1 may cross the conductive lines M at a right angle. Each of the patterns P1 may include a first resistor R1 and a first upper electrode TE1 that may be sequentially stacked.

Plug type first stacked structures S1 may be interposed between the conductive lines M and the first stacked patterns P1 on crossing points of the conductive lines M and the first stacked patterns P1. The first stacked structure S1 may be a stacked structure that may include a first tungsten plug W1, a first vertical diode D1, and a first lower electrode BE1. The first vertical diode D1 may be formed as a stacked structure including an n-type oxide layer n0, for example, $TiO_2$, and a p-type oxide layer p0, for example, NiO. The first tungsten plug W1 may reduce a contact resistance between the first vertical diode D1 and the conductive lines M.

Second stacked patterns P2 may be formed as lines and may be arranged with constant intervals therebetween. The second stacked patterns P2 may be separated by a predetermined or desired distance from upper surfaces of the first stacked patterns P1. The second stacked patterns P2 may cross the first stacked patterns P1 at a right angle, and each of the second stacked patterns P2 may be a stacked structure including a second resistor R2 and a second upper electrode TE2.

Plug type second stacked structures S2 may be interposed between the first stacked patterns P1 and the second stacked patterns P2 on crossing points of the first and second stacked patterns P1 and P2. The second stacked structure S2 may be a stacked structure including a second tungsten plug W2, a second vertical diode D2, and a second lower electrode BE2. The second stack structure may be formed of the same material as the material of the first stacked structure S1. The second stacked structure S2 may have the same structure as the structure of the first stacked structure S1, and thus detailed description for the structure is omitted.

The first and second resistors R1 and R2 may be oxide layers, for example, NiO, that may function as data storing layers. The first and second vertical diodes D1 and D2 may have p-n junction structures including oxide layers and may function as rectifying devices that may rectify electric currents to flow in a forward direction.

A conventional multi-layer cross point RRAM device may be formed by stacking the diodes and resistors, and thus, the structure of the device may be simplified. Therefore, a multi-layer cross point RRAM device may be more highly-integrated.

However, a conventional multi-layer cross point RRAM device may use binary oxide layers, for example, $TiO_2$ and NiO, as the vertical diodes. Thus, current density through the diode may not be sufficiently high and the diode may not have a sufficient rectifying property. Further, the oxide layers for forming the diodes may be formed under a higher temperature for obtaining superior layer quality, and thus, fabricating costs may increase due to the higher temperature process.

In addition, a vertical diode of a conventional multi-layer cross point RRAM device may be formed of single crystalline silicon because a diode formed of a single crystalline silicon may have higher current density, lower turn-on current, and lower leakage current than those of a diode formed of binary-based oxide layers. However, a diode cannot be formed of single crystalline silicon if the vertical diode is formed on a predeposition layer that is formed of a metal layer or a metal oxide layer.

SUMMARY

Example embodiments may provide a multi-layer cross point resistive memory device including a diode having an improved rectifying property relative to a conventional binary-based oxide layer diode, and a method of manufacturing the same.

Example embodiments may provide a method of forming poly-silicon pattern that may be used to form a diode used in the multi-layer cross point resistive memory device.

In an example embodiment, a method of forming a poly-silicon pattern may include forming an amorphous silicon pattern on a lower layer; forming a capping layer covering the amorphous silicon pattern; poly-crystallizing the amorphous silicon pattern using an excimer laser annealing process; and removing the capping layer.

According to an example embodiment, the amorphous silicon pattern may be formed having a width ranging from 10 to 100000 Å.

According to an example embodiment, the amorphous silicon pattern may be formed having a thickness ranging from 10 to 30000 Å.

According to an example embodiment, the amorphous silicon pattern may be formed as a circular bump or a square bump.

According to an example embodiment, the excimer laser annealing process may be performed with an intensity ranging from about 200 to 3000 mJ/cm$^2$.

According to an example embodiment, a width of the poly-silicon pattern may be narrower than the width of the amorphous silicon pattern, and a height of the poly-silicon pattern may be higher than the height of the amorphous silicon pattern.

According to an example embodiment, the poly-silicon pattern may be formed in the shape of a pole.

In an example embodiment, a method of forming a vertical diode may include forming a poly-silicon pattern. Forming the poly-silicon pattern may include forming an amorphous silicon pattern on a lower layer; forming a capping layer covering the amorphous silicon pattern; poly-crystallizing the amorphous silicon pattern using an excimer laser annealing process; and removing the capping layer. The poly-silicon pattern may be doped with an n-type impurity and a p-type impurity. The poly-silicon may be annealed to activate the impurities.

According to an example embodiment, the annealing of the poly-silicon pattern that is doped with the impurities may be performed using an excimer laser.

According to an example embodiment, the poly-silicon pattern may be formed in the shape of a pole.

In an example embodiment, a method of manufacturing a multi-layer cross point resistive memory device may include forming a conductive line on a semiconductor substrate. A first vertical diode may be formed on the conductive line. A first lower electrode may be formed on the first vertical diode. A first line-shaped stacked pattern may be formed on the first lower electrode so as to cross the conductive line at a right angle, the first-line shaped stacked pattern including a first resistor and a first upper electrode that may be sequentially stacked. A second vertical diode may be formed on the first stacked pattern. A second lower electrode may be formed on the second vertical diode. A second stacked pattern may be formed on the second lower electrode so as to cross the first stacked pattern at a right angle, the second stacked pattern including a second resistor and a second upper electrode that may be sequentially stacked. The first and second vertical diodes may be formed by forming a poly-silicon pattern. Forming the poly-silicon pattern may include forming an amorphous silicon pattern; forming a capping layer covering the amorphous silicon pattern; poly-crystallizing the amorphous silicon pattern using an excimer laser annealing process; and removing the capping layer. The poly-silicon pattern may be doped with an n-type impurity and a p-type impurity. The poly-silicon may be annealed to activate the impurities According to an example embodiment, at least one of forming the first vertical diode and forming the second vertical diode may include forming an interlayer dielectric covering the poly-silicon pattern; and performing one of a chemical mechanical polishing (CMP) process and an etch-back process on the interlayer dielectric to expose the poly-silicon pattern.

In an example embodiment, a vertical diode may include a poly-silicon pattern formed on a lower layer; an n-type impurity region formed on a lower portion of the poly-silicon pattern and a p-type impurity region formed on an upper portion of the poly-silicon pattern.

According to an example embodiment, the lower layer may be formed of a metal material.

According to an example embodiment, the poly-silicon pattern may be formed in the shape of a pole.

In an example embodiment, a multi-layer cross point resistive memory device may include a conductive line formed on a semiconductor substrate. A first vertical diode may be formed on the conductive line. A first lower electrode may be formed on the first vertical diode. A first stacked line-shaped pattern may be formed on the first lower electrode so as to cross the conductive line at a right angle, the first stacked line-shaped pattern including a first resistor and a first upper electrode that may be sequentially stacked. A second vertical diode may be formed on the first stacked pattern. A second lower electrode may be formed on the second vertical diode. A second stacked line-shaped pattern may be formed on the second lower electrode so as to cross the first stacked pattern at a right angle, the second stacked line-shaped pattern including a second resistor and a second upper electrode that may be sequentially stacked. The first and second vertical diodes may be formed by forming a poly-silicon pattern on a lower layer; an n-type impurity region may be formed on a lower portion of the poly-silicon pattern and a p-type impurity region may be formed on an upper portion of the poly-silicon pattern.

According to an example embodiment, the first and second vertical diodes may have narrower widths than widths of the first and second stacked patterns.

According to an example embodiment, at least one of the first and second vertical diodes may be formed in the shape of a pole.

According to an example embodiment, at least one stacked structure may be formed on the second stacked pattern having a same structure as a stacked structure including the first vertical diode, the first lower electrode, and the first stacked pattern.

According to an example embodiment, at least one stacked structure may be formed on the second stacked pattern having a same structure as a stacked structure including the first vertical diode, the first lower electrode, the first stacked pattern, the second vertical diode, the second lower electrode, and the second stacked pattern.

According to an example embodiment, at least one stacked structure may be formed on the second stacked pattern having a same structure as a stacked structure including the first vertical diode, the first lower electrode, the first stacked pattern, the second vertical diode, the second lower electrode, the second stacked pattern, the first vertical diode, the first lower electrode, and the first stacked pattern.

According to an example embodiment, barrier layers may be formed between the conductive line and the first vertical diode and between the first stacked pattern and the second vertical diode.

BRIEF DESCRIPTION OF THE DRAWINGS

Example embodiments will be described with reference to the accompanying drawings.

FIG. 3 is a photograph showing an amorphous silicon (a-Si) pattern before performing an excimer laser annealing process in a method of forming the poly-silicon pattern according to an example embodiment.

FIGS. 4A through 4C are photographs of poly-silicon patterns formed by the excimer laser annealing process according to an example embodiment, using lasers of 870 mJ/cm$^2$, 950 mJ/cm$^2$, and 1030 mJ/cm$^2$ strengths.

FIG. 5 is a photograph showing a cross-section of the poly-silicon pattern formed using a method according to an example embodiment.

DESCRIPTION OF EXAMPLE EMBODIMENTS

Figure 1:
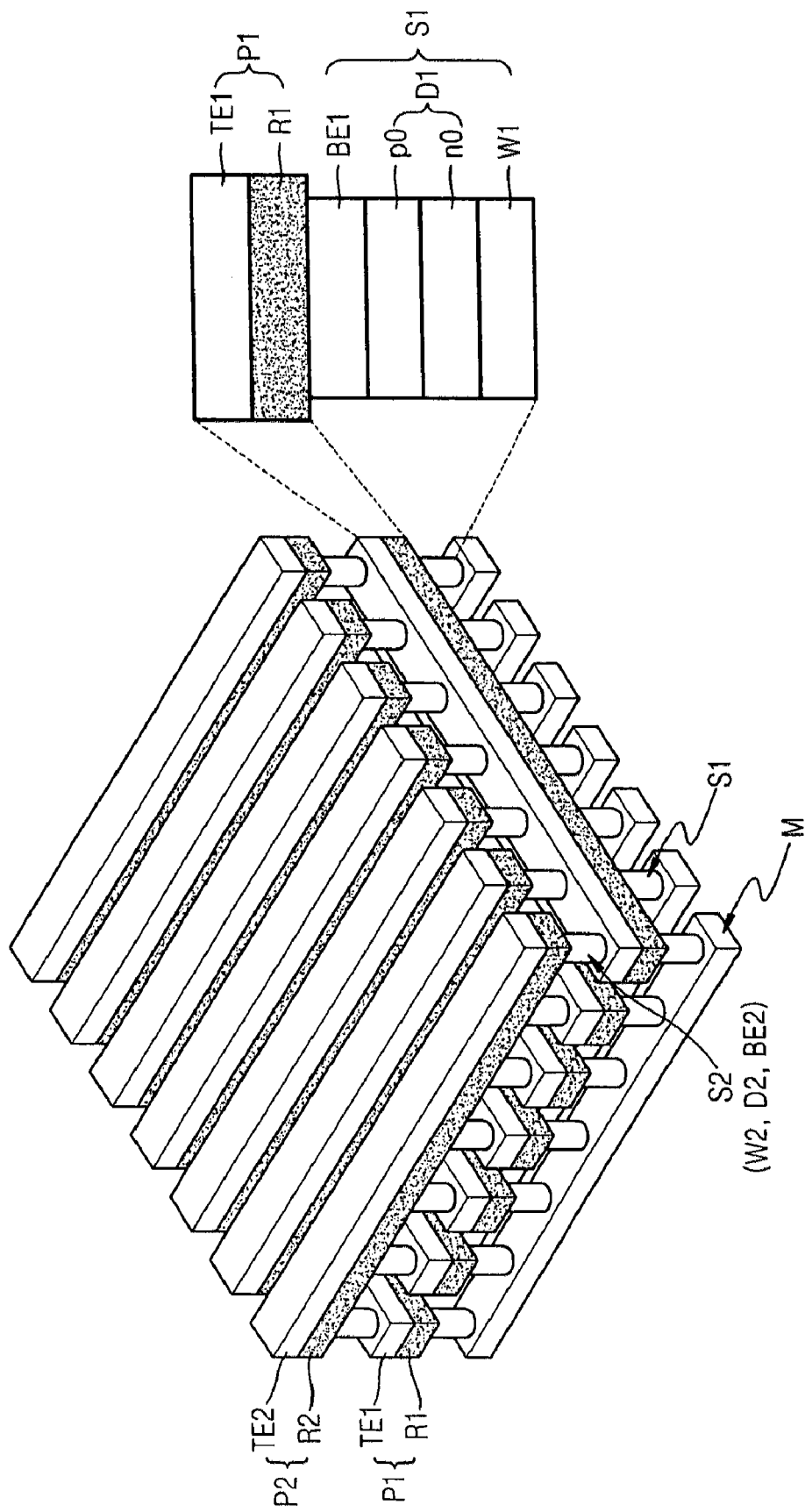
FIG. 1 is a perspective view of a conventional multi-layer cross point resistive memory device.

Example embodiments will now be described more fully with reference to the accompanying drawings. Example embodiments, however, may be embodied in many different forms and should not be construed as limited to the example embodiments set forth herein. Rather, the example embodiments are provided so that this disclosure will be thorough, and will convey the scope of the invention to those skilled in the art. In the drawings, the thicknesses of layers and regions are exaggerated for clarity.

It will be understood that when an element or layer is referred to as being "on", "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-section illustrations that may be schematic illustrations of idealized embodiments (and intermediate structures). As such, variations from the shapes of the illustrations as a result, for example, of manufacturing techniques and/or tolerances, are to be expected. Thus, the example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to limit the example embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments may provide a multi-layer cross point resistive memory device that may include a diode that may be formed of poly-silicon, rather than an oxide layer. For example, a poly-silicon diode may have an improved rectifying property.

Example embodiments may provide a method of forming a diode using poly-silicon may include poly-crystallizing an amorphous silicon pattern by an excimer laser annealing (ELA) process to form a poly-silicon pattern formed in the shape of a pole. N-type and p-type impurities may be doped in the poly-silicon pattern. According to this method, a poly-silicon diode may be fabricated, and a multi-layer cross point resistive memory device including a poly-silicon diode may be manufactured.

Figure 2A:
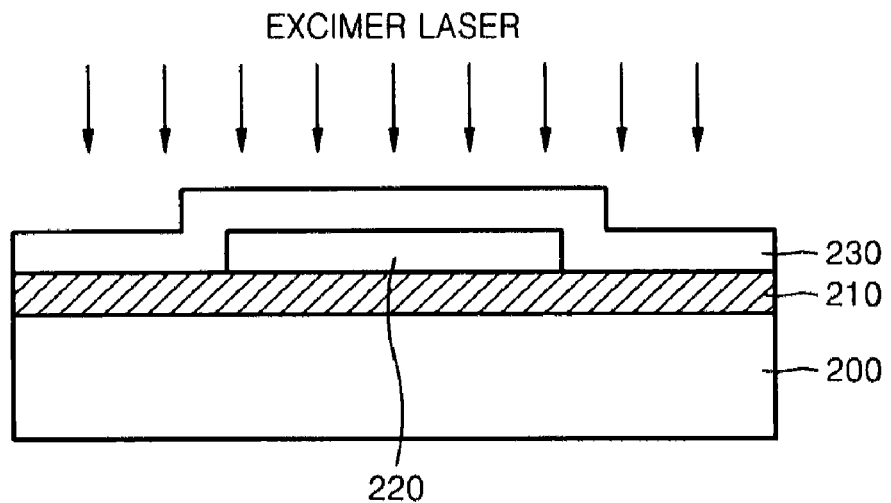
FIGS. 2A through 2C are cross-sectional views illustrating a method of forming a poly-silicon pattern according to an example embodiment.
Figure 2B:
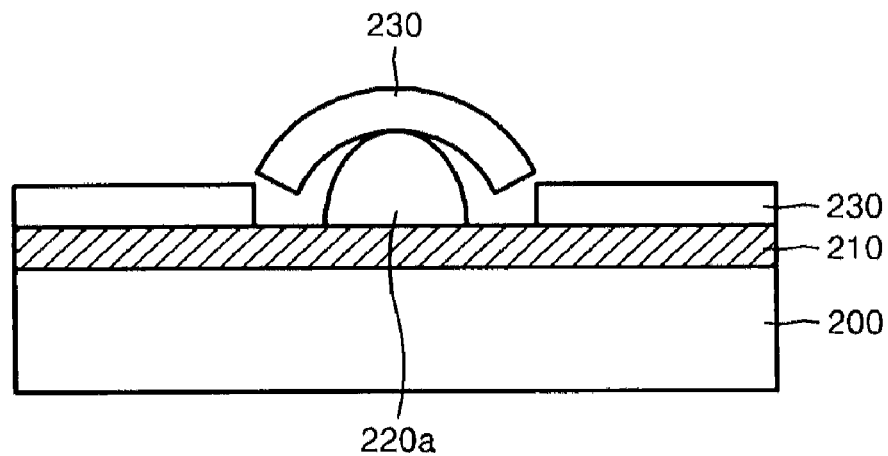
Figure 2C:
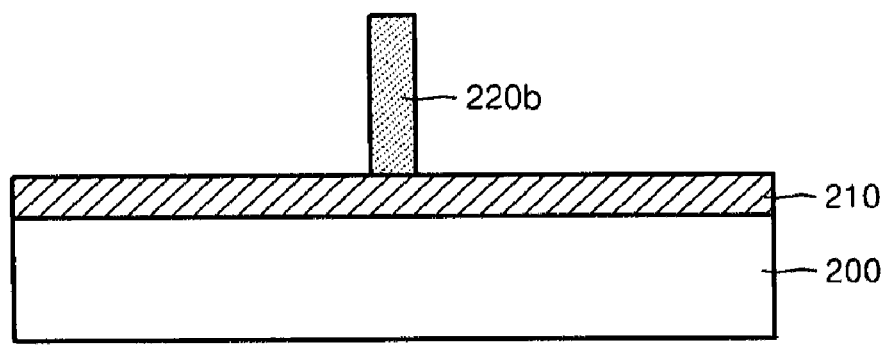

FIGS. 2A through 2C are cross-sectional views illustrating a method of forming a poly-silicon pattern according to an example embodiment. The method illustrates forming a poly-silicon pattern before doping the n-type and p-type impurities in the poly-silicon pattern to form a diode.

Referring to FIG. 2A, a predetermined or desired lower pattern 210 may be formed on a semiconductor substrate 200. For example, the lower pattern may be formed of a metal material.

An amorphous silicon pattern 220 may be formed as a bump having a first width and a first height on the lower pattern 210. For example, the amorphous silicon pattern 220 may be formed as a circular bump or a square bump having a width ranging from about 10 to 100000 Å and a thickness ranging from about 10 to 30000 Å.

A capping layer 230 may be formed so as to cover the amorphous silicon pattern 220. For example, the capping layer 230 may be a silicon oxide layer.

An excimer laser may be irradiated onto the capping layer 230 to poly-crystallize the amorphous silicon pattern 220. The intensity of the excimer laser may be in a range from about 200 to 3000 mJ/cm$^2$.

If the excimer laser is irradiated, the amorphous silicon pattern 220 may absorb the laser beam, and a temperature of the amorphous silicon pattern 220 may rapidly increase. Accordingly, the amorphous silicon pattern may be partially or completely melted. On the contrary, the portion of the lower pattern 210 on which the amorphous silicon pattern 220 is not formed may reflect the laser beam. For example, the laser beam may be reflected because the lower pattern 210 may be formed of the metal material.

Referring to FIG. 2B, the amorphous silicon pattern melted by the excimer laser beam may be formed as a hemisphere due to a surface tension. If the melted silicon pattern is cooled, seeds for crystallizing may be generated in a lower center portion of the pattern. The seeds may be generated in the lower center portion of the melted silicon pattern because flowing of the fluid may be the slowest at the lower center portion. The poly-crystallization may proceed upward from the seeds in the lower center portion. Reference numeral 220a denotes a silicon pattern in a process of poly-crystallization.

Cracks may be formed on step portions of the capping layer 230 during the poly-crystallization process.

Referring to FIG. 2C, the poly-silicon pattern 220b may be formed in the shape of a pole from the amorphous silicon pattern 220 using the poly-crystallization process through the ELA. The capping layer 230 may be removed. For example, the poly-silicon pattern 220b may have a second width that may be narrower than the first width and a second height that may be higher than the first height.

FIG. 3 is a photograph showing the amorphous silicon (a-Si) pattern before performing the ELA process. FIGS. 4A through 4C are photographs showing poly-silicon (poly-Si) patterns formed by performing the ELA processes with intensities of 870 mJ/cm$^2$, 950 mJ/cm$^2$, and 1030 mJ/cm$^2$, respectively. Referring to FIGS. 3 and 4A through 4C, the poly-silicon pattern may be formed having a smaller width than the width of the amorphous silicon pattern.

FIG. 5 is a photograph showing a cross-section of the poly-silicon pattern formed using a method according to an example embodiment. Referring to FIG. 5, a micro structure of the poly-crystallized poly-silicon pattern is shown.

As described above, after forming the pole-shaped poly-silicon pattern 220b according to an example embodiment as shown in FIG. 2C, the poly-silicon pattern 220b may be doped with n-type impurity and p-type impurity to form a vertical diode.

Figure 6:
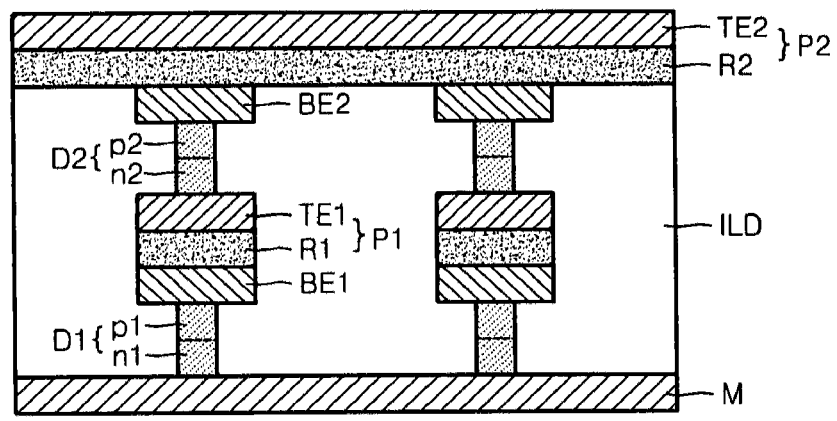
FIGS. 6 and 7 are cross-sectional view and a perspective view of a multi-layer cross point resistive memory device according to an example embodiment.
Figure 7:
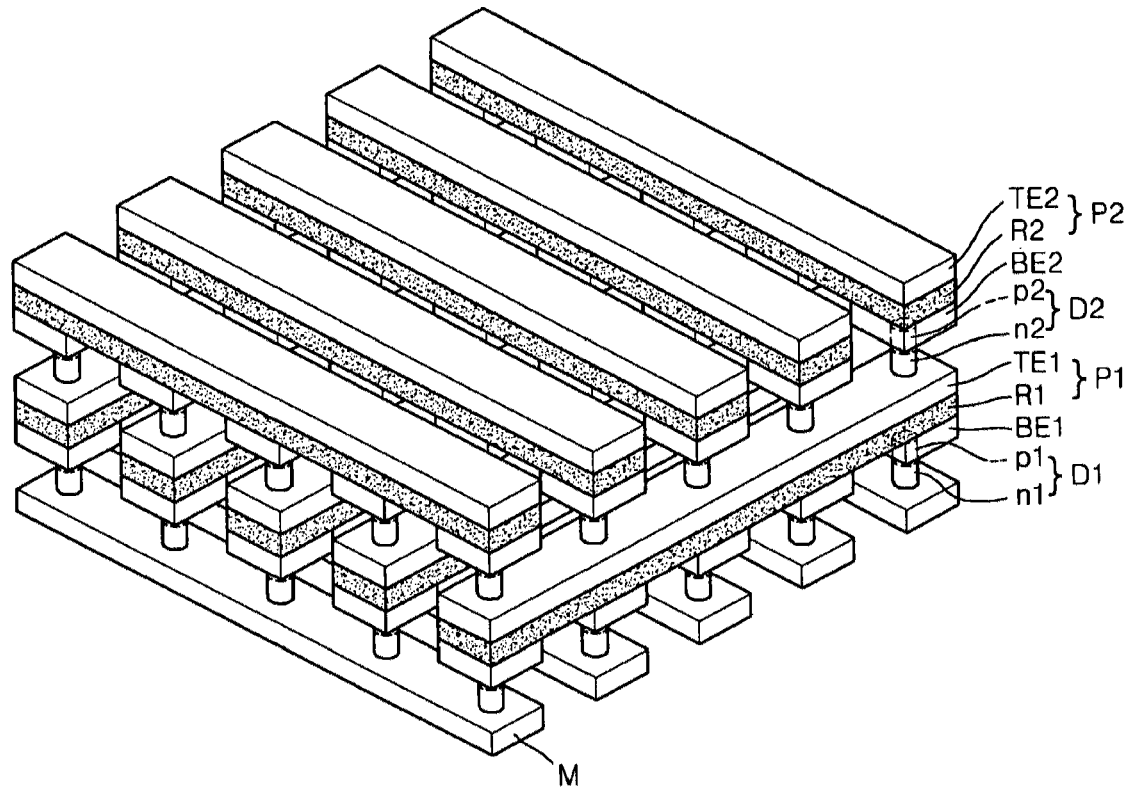

FIGS. 6 and 7 are cross-sectional view and a perspective view of a multi-layer cross point resistive memory device including a poly-silicon diode according to an example embodiment.

Referring to FIGS. 6 and 7, a multi-layer cross point resistive memory device may include a conductive line M that may be formed on a semiconductor substrate (not shown). For example, the conductive line M may be formed of a metal material. A plurality of conductive lines M may be formed on the semiconductor substrate with constant intervals therebetween. Although it is not shown in the drawings, the conductive line M may include a barrier layer, for example, TiN, on an upper portion thereof.

First vertical diodes D1 that may be formed of poly-silicon may be arranged on the conductive lines M with constant intervals therebetween. Each first vertical diode D1 may include a first n-type impurity region n1 on a lower portion and a first p-type impurity region p1 on an upper portion.

First lower electrodes BE1 may be disposed on the first vertical diodes D1. The first lower electrodes BE1 may be independently formed on each of the first diodes D1. The first lower electrodes BE1 may be formed as pads larger than the first vertical diodes D1.

First stacked patterns P1 may be formed on the first lower electrodes BE1 as lines that may cross the conductive lines M at right angles. The first stacked patterns P1 may be arranged at constant intervals. Each of the first stacked patterns P1 may include a first resistor R1 and a first upper electrode TE1 that may be sequentially stacked. The first stacked patterns P1 may include a barrier layer (not shown) on an upper portion thereof.

Second vertical diodes D2 that may be formed of poly-silicon may be arranged on the first stacked patterns P1 at constant intervals therebetween. Each of the second vertical diodes D2 may include a second n-type impurity region n2 on a lower portion and a second p-type impurity region p2 on an upper portion.

Second lower electrodes BE2 may be disposed on the second vertical diodes D2. The second lower electrodes BE2 may be independently formed on the second vertical diodes D2 in the same manner as the first lower electrodes BE1, and may be formed as pads larger than the second vertical diodes D2.

Second stacked patterns P2 may formed on the second lower electrodes BE2 as lines that may cross the first stacked pattern P1 at right angles. The first stacked patterns P2 may be arranged at constant intervals. Each of the second stacked patterns may include a second resistor R2 and a second upper electrode TE2 that may be sequentially stacked. The second stacked patterns P2 may include a barrier layer (not shown) on an upper portion thereof.

For example, in the multi-layer cross point resistive memory device, the conductive lines M and the first stacked patterns P1 may be formed to cross each other at right angles while being spaced apart from each other by a predetermined distance. The first vertical diodes D1 may be disposed on the cross points of the conductive lines M and the first stacked patterns P1. The first stacked patterns P1 and the second stacked patterns P2 may be formed to cross each other at right angles while being separated by a predetermined or desired distance from each other. The second vertical diodes D2 may be disposed on the cross points of the first and second stacked patterns P1 and P2.

The first and second vertical diodes D1 and D2 may be formed of poly-silicon patterns that may be obtained by poly-crystallizing the amorphous silicon patterns formed on the conductive lines M and the first stacked patterns P1 using the ELA process. For example, the first and second vertical diodes D1 and D2 may be formed by doping the n-type and p-type impurities in the poly-silicon patterns that may be formed in the shape of poles, according to an example embodiment as shown in FIGS. 2A through 2C. The first and second vertical diodes D1 and D2 may have widths that may be narrower than widths of the first and second stacked patterns P1 and P2. For example, the widths of the first and second vertical diodes D1 and D2 may be ⅓ of the widths of the first and second stacked patterns P1 and P2, respectively.

In FIG. 6, reference numeral ILD is an interlayer dielectric. The interlayer dielectric is not shown in FIG. 7.

Although it is not shown in the drawings, the multi-layer cross point resistive memory device may include one or more stacked structures formed on the second stacked patterns P2.

For example, the one or more stacked structures may have the same structure as a stacked structure including the first vertical diode D1, the first lower electrode BE1, and the first stacked pattern P1.

For example, the one or more stacked structures may have the same structure as a stacked structure including the first vertical diode D1, the first lower electrode BE1, the first stacked pattern P1, the second vertical diode D2, the second lower electrode BE2, and the second stacked pattern P2.

For example, the one or more stacked structures may have the same structure as a stacked structure including the first vertical diode D1, the first lower electrode BE1, the first stacked pattern P1, the second vertical diode D2, the second lower electrode BE2, the second stacked pattern P2, the first vertical diode D1, the first lower electrode BE1, and the first stacked pattern P1.

FIGS. 8A through 8F are cross-sectional views illustrating a method of manufacturing a multi-layer cross point resistive memory device according to an example embodiment.

Figure 8A:
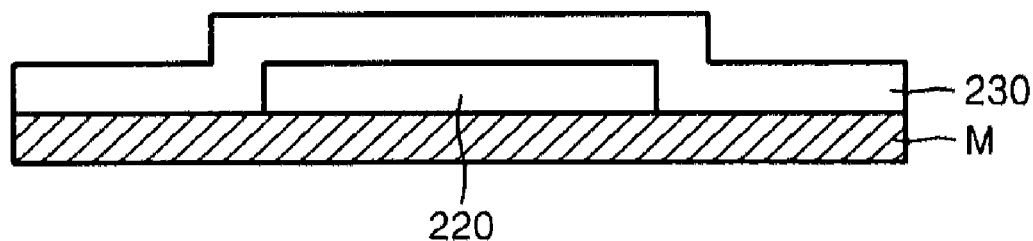
FIGS. 8A through 8F are cross-sectional views illustrating a method of fabricating a multi-layer cross point resistive memory device according to an example embodiment.

Referring to FIG. 8A, a conductive line M may be formed on a semiconductor substrate (not shown). For example, the conductive line M may be formed of a metal material. An amorphous silicon pattern 220 may be formed on the conductive line M. For example, the amorphous silicon pattern 220 may be a circular bump or a square bump having a width ranging from about 10 to 100000 Å and a thickness ranging from about 10 to 30000 Å.

A capping layer 230 may be formed so as to cover the amorphous silicon pattern 220. For example, the capping layer 230 may be a silicon oxide layer.

Figure 8B:
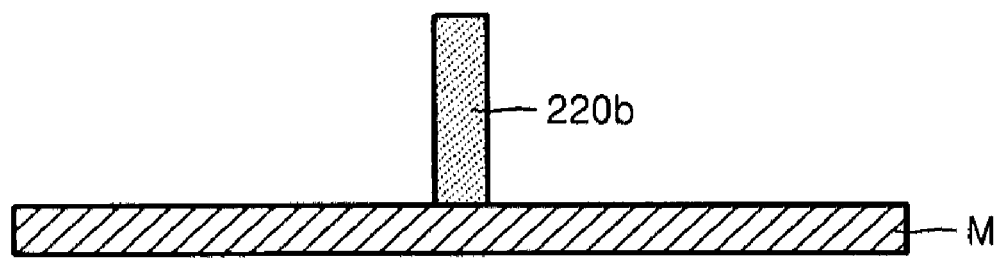

Referring to FIG. 8B, the amorphous silicon pattern 220 may be poly-crystallized by irradiating the excimer laser beam on the substrate (not shown), on which the capping layer 230 may be formed, and a poly-silicon pattern 220b may be formed in the shape of a pole. The poly-silicon pattern 220b may have a width smaller than the width of the amorphous silicon pattern 220, and a height higher than the height of the amorphous silicon pattern 220. For example, the intensity of the excimer laser beam may be in a range from about 200 to 3000 mJ/cm$^2$.

The capping layer 230 may be removed using a wet-cleaning process.

Figure 8C:
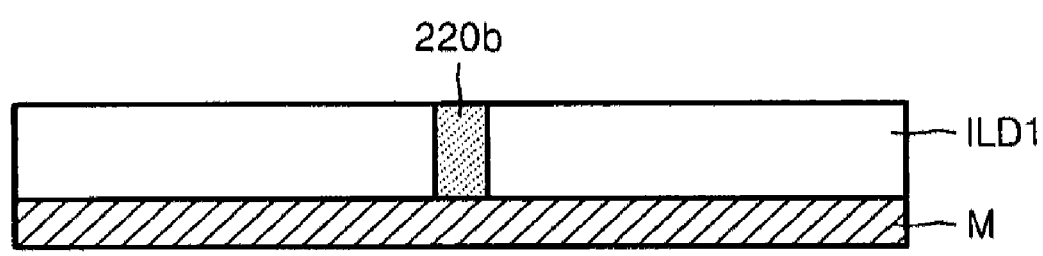

Referring to FIG. 8C, an interlayer dielectric may be formed so as to cover the poly-silicon pattern 220b. The interlayer dielectric may be processed to provide a first interlayer dielectric ILD1 that may expose the poly-silicon pattern 220b. For example, the interlayer dielectric layer may be processed using a chemical mechanical polishing (CMP) or an etch-back process.

Figure 8D:
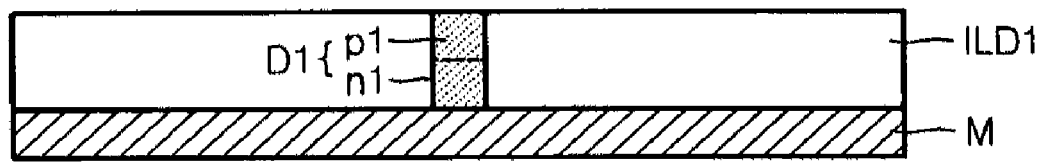

Referring to FIG. 8D, the poly-silicon pattern 220b may be doped with n-type and p-type impurities. The doped poly-silicon pattern 220b may be annealed so that the impurities doped on the poly-silicon pattern 220b may be activated. The first vertical diode D1 may be formed of the poly-silicon pattern 220b and may include a first n-type impurity region n1 on a lower portion and a first p-type impurity region p1 on an upper portion.

The depth of infiltration of the impurities in the doping process may be altered by the controlling energy used in the ion implantation. The annealing process used to activate the impurities may be performed using an excimer laser. For example, if the excimer laser is used to perform the annealing process, the energy of laser beam may be concentrated onto the doped poly-silicon pattern so that the process is not performed under higher temperature.

Figure 8E:
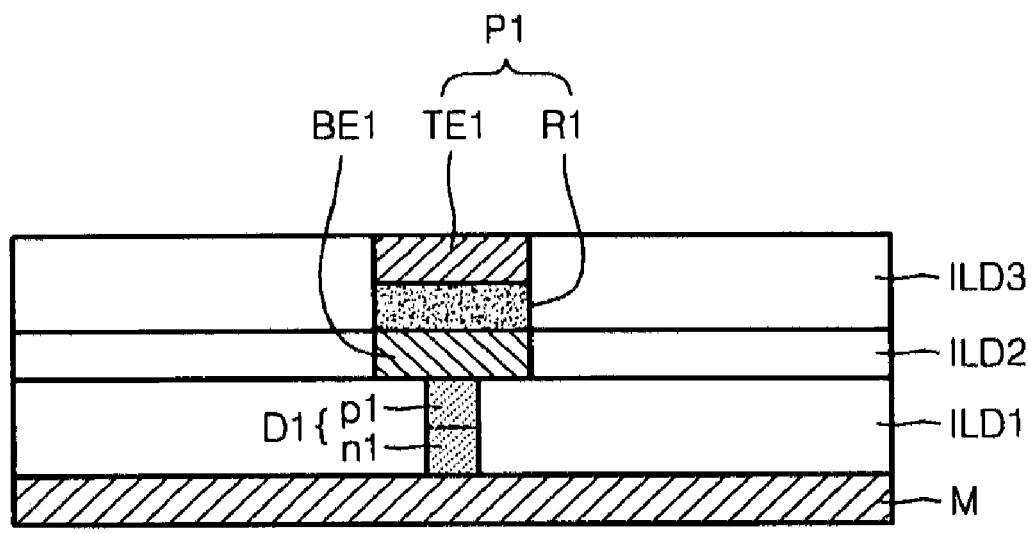

Referring to FIG. 8E, a pad-type first lower electrode BE1 may be formed on the first vertical diode D1. For example, the pad-type first lower electrode BE1 may be a predetermined or desired shape, for example, a square shape or rectangular shape. The first lower electrode BE1 may be larger than the first vertical diode D1.

A second interlayer dielectric layer ILD2 that may have the same height as the first lower electrode BE1 may be formed on the first interlayer dielectric ILD1. For example, the second interlayer dielectric layer ILD2 may not be formed on the region where the first lower electrode BE1 may be formed.

A line-shaped first stacked pattern P1 may be formed on the first lower electrode BE1 and the second interlayer dielectric ILD2 and may cross the conductive line M at a right angle. The first stacked pattern P1 may include a first resistor R1 and a first upper electrode TE1 that may be sequentially stacked.

A third interlayer dielectric ILD3 having the same height as that of the first stacked pattern P1 may be formed on the second interlayer dielectric ILD2 on both sides of the first stacked pattern P1.

Figure 8F:
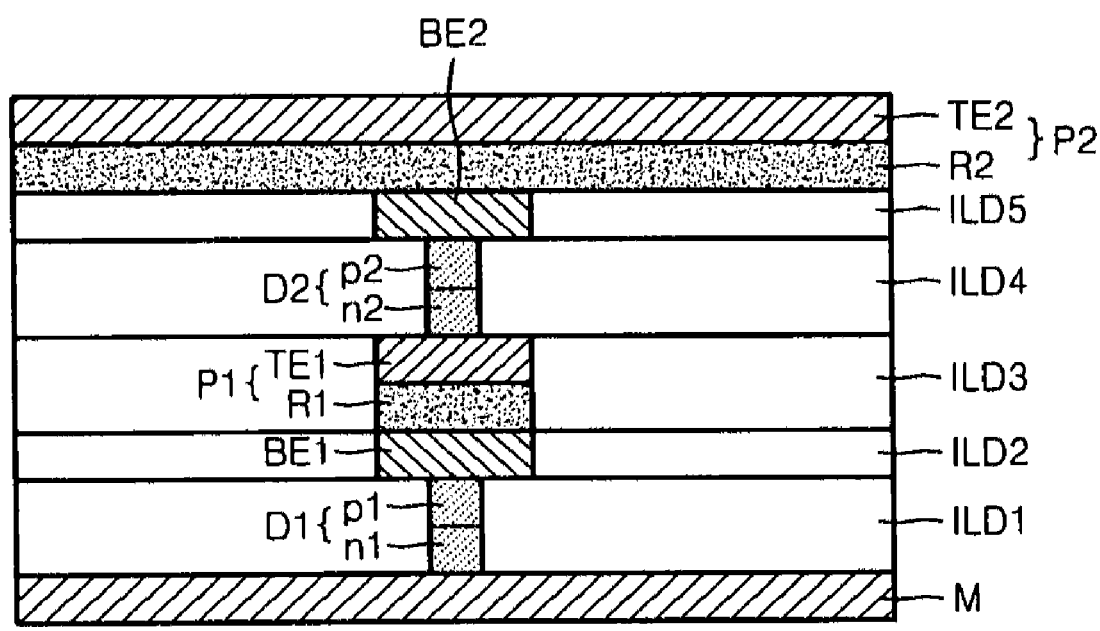

Referring to FIG. 8F, a second vertical diode D2 may formed on the first stacked pattern P1 using the same method used to form the first vertical diode D1. For example, the second vertical diode may be formed of poly-silicon and may include a second n-type impurity region n2 on a lower portion and a second p-type impurity region p2 on an upper portion. Reference numeral ILD4 denotes a fourth interlayer dielectric that may be formed using the same process used to form the first interlayer dielectric ILD1.

A second lower electrode BE2 may be formed on the second vertical diode D2 using the same process used to form the first lower electrode BE1. A fifth interlayer dielectric ILD5 having the same height as that of the second lower electrode BE2 may be formed on the fourth interlayer dielectric ILD4. For example, the fifth interlayer dielectric layer ILD5 may not be formed on the region where the second lower electrode BE2 may be formed.

A line-shaped second stacked pattern P2 may be formed on the second lower electrode BE2 and the fifth interlayer dielectric ILD5 and may cross the first stacked pattern P1 at a right angle. The second stacked pattern P2 may include a second resistor R2 and a second upper electrode TE2 that may be sequentially stacked.

Although it is not shown in the drawings, a 1 diode-1 resistor (1D-1R) structure may be formed on the second stacked pattern. The 1D-1R may have the same structure as a stacked structure including the first vertical diode D1, the first lower electrode BE1, and the first stacked pattern P1. The 1D-1R structure may be successively formed while changing the arranging angle by 90°.

As described above, a poly-silicon diode obtained by poly-crystallizing an amorphous silicon pattern using an ELA process and doping n-type and p-type impurities, according to example embodiments, may have higher current density in a forward direction and lower leakage current than those of the conventional binary-based oxide layer diode. Thus, an improved rectifying property, for example, an improved switching property, may be obtained.

A poly-silicon p-n junction, according to example embodiments, may have an improved rectifying property relative to other poly-silicon p-n junctions formed under a conventional method, for example, a method of poly-crystallizing an amorphous silicon layer that may not patterned using an ELA process and/or performing impurity doping and patterning processes.

Figure 9:
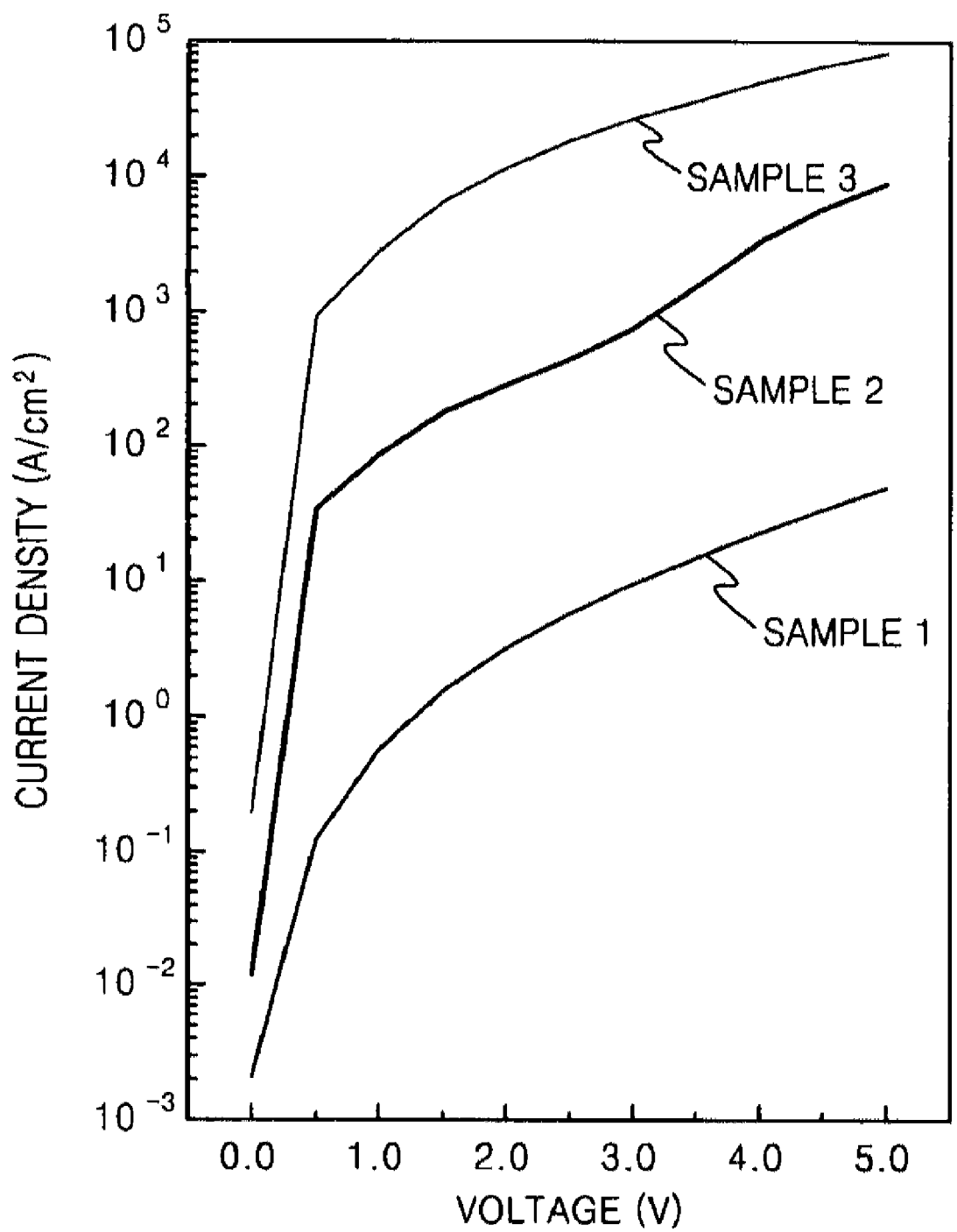
FIG. 9 is a graph of voltages versus electric currents in three samples for representing advantages of example embodiments.

FIG. 9 is a voltage-current (V-I) graph showing V-I characteristics of p-n junctions formed under different conditions. Samples 1 through 3 are thin film transistors (TFTs) fabricated under different fabricating conditions from each other in order to test characteristics thereof. Sample 1 and sample 2 include p-n junctions fabricated using the above conventional method, and sample 3 includes a p-n junction fabricated using a method according to an example embodiment. Sample 1 is fabricated using the ELA process of the intensity of 450 mJ/cm$^2$, and sample 2 and sample 3 are fabricated using the ELA process of the intensity of 950 mJ/cm$^2$.

Referring to FIG. 9, V-I curve of sample 3 is located higher than V-I curves of the samples 1 and 2, which means the current density in forward direction of the sample 3 may be higher than those of the samples 1 and 2. For example, sample 3 may generate a larger amount of electric current in a short period of time than samples 1 and 2. Even if the intensities of the laser beams applied to sample 2 and sample 3 are equal to each other, the rectifying performance of sample 3 may be improved over sample 2.

A method of fabricating a poly-silicon diode, according to example embodiments, may not require a higher temperature process such as used in a conventional method of forming an oxide layer diode, rather it may be performed under a lower temperature. Therefore, an increase in fabrication cost and a degradation of the reliability of the device caused by a higher temperature process may be reduced or prevented.

A method of fabricating a poly-silicon pattern, according to example embodiments, may be used to form finer poly-silicon patterns, and thus, a device may be more highly integrated.

A multi-layer cross point resistive memory device, according to example embodiments, may not require first and second tungsten plugs W1 and W2, which may be required in a conventional device as shown in FIG. 1. For example, a conventional oxide layer diode may require the tungsten plug in order to reduce the contact resistance with the lower conductive lines M, however, a poly-silicon diode may not require the additional tungsten plug.

As described above, according to example embodiments, a poly-silicon pattern that may be formed in the shape of a pole may be formed from an amorphous silicon pattern using an ELA process. A vertical diode that may be obtained from the poly-silicon pattern may be applied to the multi-layer cross point resistive memory device.

A poly-silicon diode, according to example embodiments, may have higher current density and smaller leakage current than those of a conventional binary-based oxide layer diode, and thus, the multi-layer cross point resistive memory device including the poly-silicon diode may have improved operational properties.

A method of forming a poly-silicon diode, according to example embodiments, may not require a higher temperature process such as used in a conventional method of forming an oxide layer diode. Thus, an increase in fabrication cost and a degradation of the device reliability that may be caused by a conventional higher temperature process may be reduced or prevented.

A method of forming a poly-silicon pattern, according to example embodiments, may produce a pole-shaped poly-silicon pattern that may be smaller than a conventional pattern, and thus, a device may be more highly integrated.

A multi-layer cross point resistive memory device, according to example embodiments, may not require an additional tungsten plug for reducing the contact resistance between the electrode (e.g., the conductive line and stacked pattern) and the diode, and thus, fabrication costs and the number of processes may not be increased.

While the example embodiments have been particularly shown and described, it will be understood by those of ordinary skill in the art that various changes in form and details may be made therein without departing from the spirit and scope as defined by the following claims.

What is claimed is:

1. A multi-layer cross point resistive memory device comprising:
   a conductive line on a semiconductor substrate;
   a first vertical diode on the conductive line;
   a first lower electrode on the first vertical diode;
   a first stacked line-shaped pattern on the first lower electrode crossing the conductive line at a right angle, the first stacked line-shaped pattern including a first resistor for storing first data, the first data being physically stored in the first resistor, and a first upper electrode that are sequentially stacked;
   a second vertical diode on the first stacked pattern;
   a second lower electrode on the second vertical diode; and
   a second stacked line-shaped pattern on the second lower electrode crossing the first stacked pattern at a right angle, the second stacked line-shaped pattern including a second resistor for storing second data, the second data being physically stored in the second resistor, and a second upper electrode that are sequentially stacked,
   wherein
   at least one of the first and second vertical diodes includes a poly-silicon pattern, an n-type impurity region on a lower portion of the poly-silicon pattern, and a p-type impurity region on an upper portion of the poly-silicon pattern, and
   the first and second vertical diodes have narrower widths than widths of the first and second lower electrodes.

2. The memory device of claim 1, wherein the first and second vertical diodes have narrower widths than widths of the first and second stacked patterns.

3. The memory device of claim 1, wherein at least one of the first and second vertical diodes is pole-shaped.

4. The memory device of claim 1, further comprising:
   at least one stacked structure on the second stack pattern having a same structure as a stacked structure including the first vertical diode, the first lower electrode, and the first stacked pattern.

5. The memory device of claim 1, further comprising:

at least one stacked structure on the second stack pattern having a same structure as a stacked structure including the first vertical diode, the first lower electrode, the first stacked pattern, the second vertical diode, the second lower electrode, and the second stacked pattern.

6. The memory device of claim 1, further comprising:

at least one stacked structure on the second stack pattern having a same structure as a stacked structure including the first vertical diode, the first lower electrode, the first stacked pattern, the second vertical diode, the second lower electrode, the second stacked pattern, the first vertical diode, the first lower electrode, and the first stacked pattern.

7. The memory device of claim 1, wherein barrier layers are between the conductive line and the first vertical diode and between the first stacked pattern and the second vertical diode.

8. The memory device of claim 1, wherein the first resistor is between the first lower electrode and the first upper electrode.

9. The memory device of claim 1, wherein the first vertical diode and the second vertical diode are configured to conduct current in the same direction.

10. The memory device of claim 1, wherein the second vertical diode is directly on the first stacked line-shaped pattern.

11. The memory device of claim 1, wherein at least one of the first and the second vertical diodes is a pn diode, the pn diode including the p-type impurity region and the n-type impurity region.

12. The memory device of claim 1, wherein at least one of the first and second vertical diodes is formed by poly-crystallizing an amorphous silicon pattern using an excimer laser annealing (ELA) process with an intensity ranging from about 200 to 3000 mJ/cm$^2$.

* * * * *